US012575465B2

(12) United States Patent
Liu et al.

(10) Patent No.: US 12,575,465 B2
(45) Date of Patent: Mar. 10, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tzuan-Horng Liu, Taoyuan City (TW); Hao-Yi Tsai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 726 days.

(21) Appl. No.: 17/889,358

(22) Filed: Aug. 16, 2022

(65) Prior Publication Data

US 2024/0063098 A1 Feb. 22, 2024

(51) Int. Cl.
H01L 23/498 (2006.01)
H01L 21/48 (2006.01)
(Continued)

(52) U.S. Cl.
CPC .... H01L 23/49816 (2013.01); H01L 21/4853 (2013.01); H01L 21/486 (2013.01);
(Continued)

(58) Field of Classification Search
CPC ........... H01L 23/49816; H01L 23/3128; H01L 23/49833; H01L 23/49838; H01L 23/562; H01L 23/5389; H01L 21/4853; H01L 21/486; H01L 21/565; H01L 21/568; H01L 21/6835; H01L 25/162; H01L 25/105;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

TW 201830639 8/2018
TW 202114121 4/2021

OTHER PUBLICATIONS

"Office Action of Taiwan Counterpart Application", issued on Nov. 16, 2023, p. 1-p. 10.

*Primary Examiner* — Marlon T Fletcher
*Assistant Examiner* — Christina A Sylvia
(74) *Attorney, Agent, or Firm* — JCIPRNET

(57) ABSTRACT

A semiconductor package and a manufacturing method are provided. The semiconductor package includes a semiconductor die laterally covered by an insulating encapsulation, a first redistribution structure overlying the insulating encapsulation and a back surface of the semiconductor die, a second redistribution structure underlying the insulating encapsulation and an active surface of the semiconductor die opposite to the back surface, active through insulating vias (TIVs) penetrating through the insulating encapsulation, and dummy features. The semiconductor die is electrically coupled to the first redistribution structure through the second redistribution structure and the active TIVs. Each of the dummy features includes a dummy TIV laterally covered by the insulating encapsulation, the dummy TIVs are disposed along package edges in a top view, and the dummy features are electrically floating.

20 Claims, 13 Drawing Sheets

(51) Int. Cl.

| | |
|---|---|
| *H01L 23/31* | (2006.01) |
| *H01L 25/16* | (2023.01) |
| *H01L 21/56* | (2006.01) |
| *H01L 23/00* | (2006.01) |

(52) U.S. Cl.

CPC .... *H01L 23/3128* (2013.01); *H01L 23/49833* (2013.01); *H01L 23/49838* (2013.01); *H01L 25/162* (2013.01); *H01L 21/565* (2013.01); *H01L 24/08* (2013.01); *H01L 24/32* (2013.01); *H01L 2224/08235* (2013.01); *H01L 2224/32225* (2013.01); *H01L 2924/3511* (2013.01); *H01L 2924/35121* (2013.01); *H01L 2924/37001* (2013.01)

(58) Field of Classification Search

CPC ......... H01L 24/08; H01L 24/32; H01L 24/19; H01L 24/20; H01L 2224/08235; H01L 2224/32225; H01L 2924/3511; H01L 2924/35121; H01L 2924/37001; H01L 2221/68327; H01L 2221/68345; H01L 2221/68359; H01L 2225/1035; H01L 2225/1041; H01L 2225/1058

See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2016/0093572 | A1* | 3/2016 | Chen ................... H01L 23/5389 |
| | | | 438/126 |
| 2018/0261557 | A1* | 9/2018 | Yu ......................... H01L 25/105 |
| 2021/0384120 | A1 | 12/2021 | Liu et al. |

* cited by examiner

SEMICONDUCTOR PACKAGE AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFP), pin grid array (PGA) packages, ball grid array (BGA) packages, flip chips (FC), three-dimensional integrated circuits (3DICs), wafer level packages (WLPs), package-on-package (PoP) structures, and integrated fan-out (InFO) packages, etc. Although existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
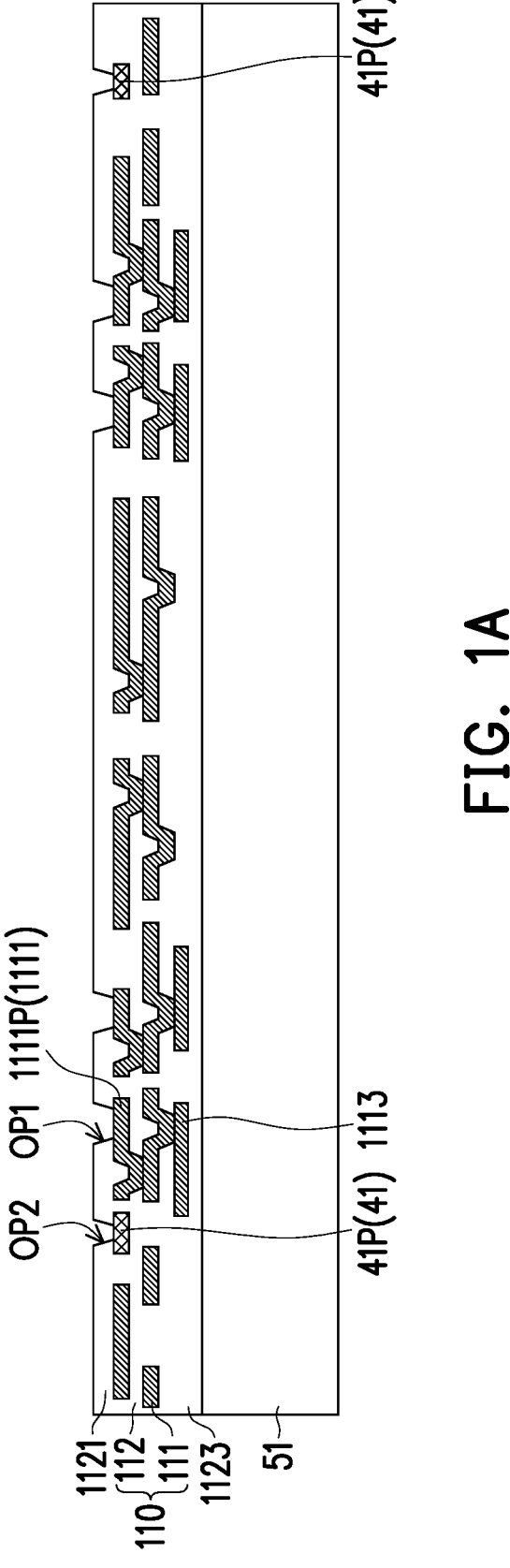
FIGS. 1A-1H are schematic cross-sectional views illustrating various stages of a manufacturing method of a semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1H are schematic cross-sectional views illustrating various stages of a manufacturing method of a semiconductor package, in accordance with some embodiments. Referring to FIG. 1A, a first redistribution structure 110 may be formed over the temporary carrier 51. The temporary carrier 51 may be made of a material such as silicon, polymer, polymer composite, metal foil, ceramic, glass, glass epoxy, tape, or other suitable material for structural support. In some embodiments, an adhesive layer (not shown) is formed on the temporary carrier 51 before the formation of the first redistribution structure 110. For example, the adhesive layer is a light-to-heat-conversion (LTHC) coating layer or the like.

The first redistribution structure 110 may include one or more first patterned conductive layer(s) 111 embedded in one or more first dielectric layer(s) 112. In some embodiments, the first dielectric layer 112 is formed of a polymer, such as polybenzoxazole (PBO), polyimide, benzocyclobutene (BCB), or the like; a nitride such as silicon nitride; an oxide such as silicon oxide, phosphosilicate glass (PSG), borosilicate glass (BSG), boron-doped phosphosilicate glass (BPSG), or the like. In an embodiment where the first dielectric layer 112 include multiple sublayers, a portion of the sublayers of the first dielectric layer 112 is formed on a different material than another portion of the sublayers for acting as etch stop sublayers and/or a resist layer. In some embodiments, the first patterned conductive layer 111 includes line portions, via portions, pad portions, and/or the like, and may be formed of suitable conductive material(s) such as copper, titanium, tungsten, aluminum, alloys, or the like.

In some embodiments, the bottommost sublayer 1123 of the first dielectric layer 112 is formed over the temporary carrier 51, and then the bottommost sublayer 1113 of the first patterned conductive layer 111 may be formed and patterned on the bottommost sublayer 1123 of the first dielectric layer 112. The steps of forming sublayers of the first dielectric layer 112 and the first patterned conductive layer 111 may be alternately repeated to form a multi-layered redistribution structure through the processes of lithography, etching, plating, and/or the like. It is noted that the number of sublayers of the first patterned conductive layer 111 and the first dielectric layer 112 in the first redistribution structure 110 construes no limitation in the disclosure. In addition, other methods of forming the first redistribution structure 110 are possible and fully intended to be included within the scope of the disclosure.

In some embodiments, the topmost sublayer 1111 of the first patterned conductive layer 111 includes pad portions 1111P accessibly revealed by first openings OP1 of the topmost sublayer 1121 of the first dielectric layer 112. The topmost sublayer 1121 of the first dielectric layer 112 may also include second openings OP2 accessibly reveal pad portions 41P of a first dummy pattern 41. For example, the pad portions 41P and the pad portions 1111P are formed at the same level in the first redistribution structure 110, and the pad portions 41P are electrically isolated from the first patterned conductive layer 111 through the first dielectric layer 112. The first dummy pattern 41 may only be formed at the locations which is free of routing of the bottommost sublayer 1111 of the first patterned conductive layer 111.

Figure 1B:
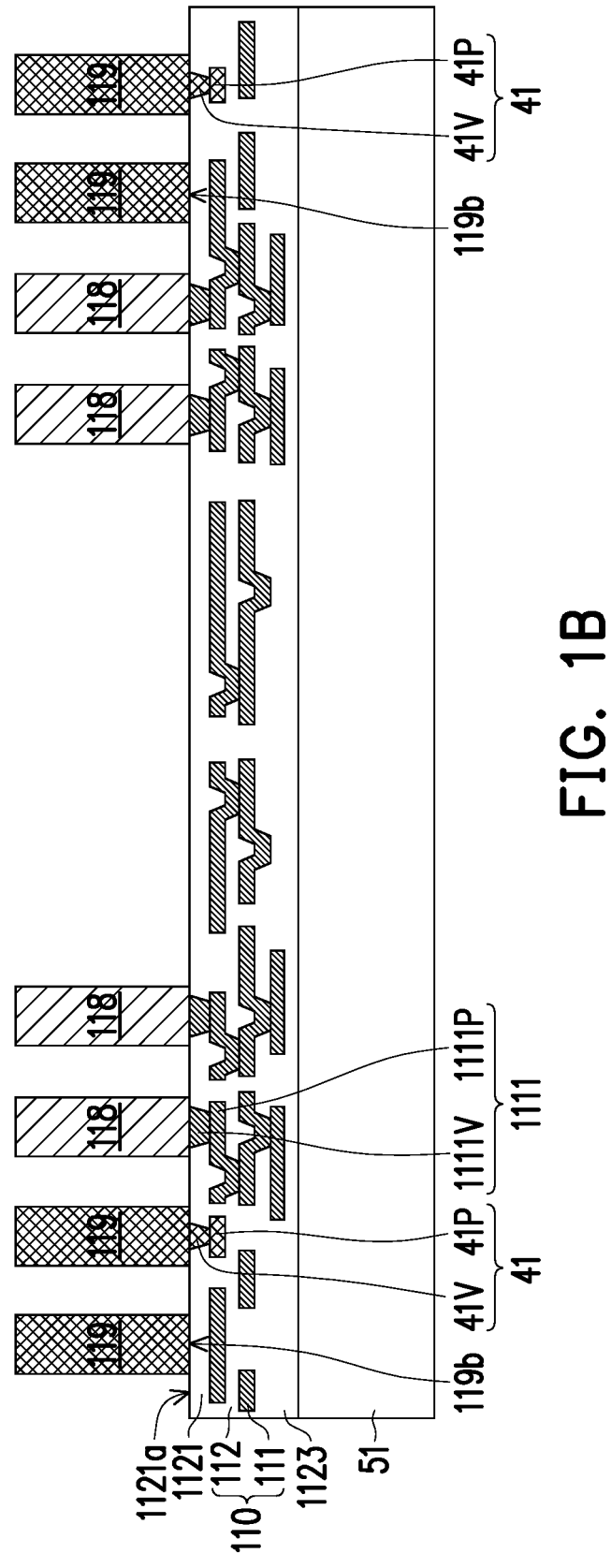

Referring to FIG. 1B and with reference to FIG. 1A, via portions 1111V of the first patterned conductive layer 111 may be formed in the first openings OP1 of the topmost sublayer 1121 of the first dielectric layer 112 and directly land on the pad portions 1111P. In some embodiments, during the formation of the via portions 1111V, via portions 41V of the first dummy pattern 41 may be formed in the second openings OP2 of the topmost sublayer 1121 of the first dielectric layer 112 and directly land on the pad portions 41P. In some embodiments, the critical dimension of the respective via portion 41V is less than the critical dimension the respective via portion 1111V of the bottommost sublayer 1111 of the first patterned conductive layer 111. The respective via portion 1111V of the bottommost sublayer 1111 of the first patterned conductive layer 111 may have a recessed top surface. In some embodiments, each of the via portions 41V of the first dummy pattern 41 has a tapering profile tapering from the corresponding second conductive pillars 119 toward the underlying pad portions 41P. The via portions 1111V of the first patterned conductive layer 111 may also have a tapering profile tapering from the corresponding first conductive pillars 118 toward the underlying pad portions 1111P.

The first conductive pillars 118 may be formed on the via portions 1111V of the first patterned conductive layer 111. During the formation of the first conductive pillars 118, second conductive pillars 119 may be formed on the via portions 41V of the first dummy pattern 41 and/or the top surface 1121a of the topmost sublayer 1121 of the first dielectric layer 112. For a portion of the second conductive pillars 119 that is directly formed on the topmost sublayer 1121 of the first dielectric layer 112, the entireties of back surfaces 119b of these second conductive pillars 119 may be in physical contact with the topmost sublayer 1121 of the first dielectric layer 112. In some embodiments, the first conductive pillars 118 are surrounded by the second conductive pillars 119. The configuration of the first and second conductive pillars 118 and 119 will be discussed in accompanying with FIGS. 2A-2E.

In some embodiments, the first and second conductive pillars 118 and 119 and/or the underlying via portions (41P and 1111V) are formed by conformally forming a seed layer on the first redistribution structure 110; forming a patterned photoresist over the seed layer, where each of the openings in the patterned photoresist corresponds to a location of the respective first and second conductive pillar 118 and 119 (and/or the via portions) to be formed; filling the openings with an electrically conductive material such as copper using, e.g., plating or the like; removing the patterned photoresist using, e.g., an ashing or a stripping process; and removing portions of the seed layer on which the first and second conductive pillars 118 and 119 (and/or the via portions) are not formed. In some embodiments, no visible interface may be observed between the first conductive pillars 118 and the underlying via portions 1111V and between the second conductive pillars 119 and the underlying via portions 41V. In alternative embodiments, the first conductive pillars 118 and/or the second conductive pillars 119 are disposed on the first redistribution structure 110 through a pick-and-place process. In such cases, a visible interface can be observed between the placed conductive pillar(s) and the underlying via portion(s). Other methods for forming the first and second conductive pillars 118 and 119 are possible and fully intended to be included within the scope of the disclosure.

Figure 1C:
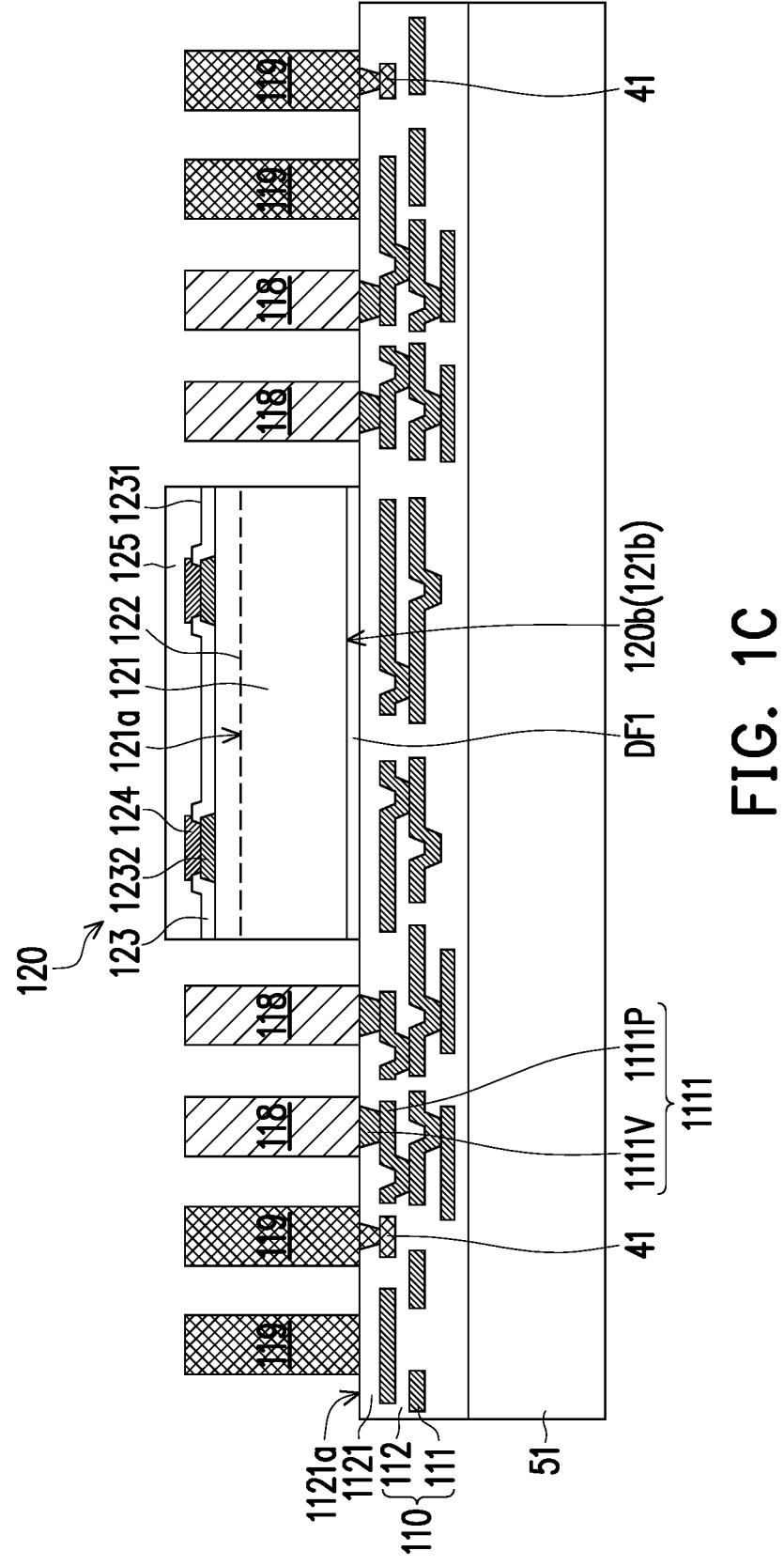

Referring to FIG. 1C, a semiconductor die 120 may be disposed on the first redistribution structure 110 and surrounded by the first and second conductive pillars 118 and 119. In some embodiments, the first conductive pillars 118 are disposed in proximity to the semiconductor die 120, while the second conductive pillars 119 are distal from the semiconductor die 120. Various configurations of the semiconductor die 120, the first conductive pillars 118, and the second conductive pillars 119 will be discussed in accompanying with FIGS. 2A-2E. The first and second conductive pillars 118 and 119 may be formed prior to the placement of the semiconductor die 120. Alternatively, the semiconductor die 120 is disposed over the first redistribution structure prior to the formation of the first and second conductive pillars 118 and 119. In some embodiments, a back surface 120b of the semiconductor die 120 is attached to the top surface 1121a of the topmost sublayer 1121 of the first dielectric layer 112 through a connecting film DF1 such as a die attach film, a layer made of adhesives or epoxy resin, or the like. Alternatively, the connecting film DF1 is omitted.

The semiconductor die 120 may include a semiconductor substrate 121 having a front surface 121a and a back surface 121b (e.g., the back surface 120b), a device layer 122 having semiconductor devices (not shown) formed in/on the front surface 121a of the semiconductor substrate 121, an interconnect structure 123 formed on the device layer 122 and electrically coupled to the semiconductor devices of the device layer 122, die connectors 124 formed on and electrically coupled to the interconnect structure 123, and a protection layer 125 formed on the interconnect structure 123 and covering the die connectors 124 for protection. The semiconductor substrate 121 may include a bulk semiconductor, a semiconductor-on-insulator (SOI) substrate, or the like, which may be doped or undoped. In some embodiments, the semiconductor substrate 121 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., SiGe, GaAsP, AlInAs, AlGaAs, GaInAs, GaInP, etc.), combinations thereof, or other suitable materials. The compound semiconductor substrate may have a multilayer structure, or the substrate may include a multilayer compound semiconductor structure.

The semiconductor devices in the device layer 122 may be or include active devices (e.g., transistors, diodes, etc.) and/or passive devices (e.g., capacitors, resistors, inductors, etc.), or other suitable electrical devices. The interconnect structure 123 may include one or more interconnect wiring layer(s) embedded in one or more interconnect dielectric layer(s), where the interconnect wiring layers are electrically coupled to the semiconductor devices in the device layer 122 and the die connectors 124. The uppermost sublayer of the interconnect dielectric layer may include a passivation sublayer 1231 made of one or more suitable dielectric materials such as silicon oxide, silicon nitride, low-k dielectrics, polyimide, combinations of these, or the like. The uppermost sublayer of the interconnect wiring layers may include contact pads 1232 made of one or more suitable conductive materials such as aluminum, copper, alloy, or the like, where the contact pads 1232 may be partially covered by the passivation sublayer 1231, and the die connectors 124 may be formed on the exposed surfaces of the contact pads 1232.

The die connectors 124 may include a conductive material such as solder, copper, aluminum, gold, nickel, silver, palladium, tin, the like, or a combination thereof. In some embodiments, the die connectors 124 include metal pillars (e.g., a copper pillar) formed by a sputtering, printing, plating, chemical vapor deposition (CVD), or the like, with or without a solder cap thereon. The metal pillars may be solder-free and have substantially vertical sidewalls or tapered sidewalls. The protection layer 125 may be formed on the passivation sublayer 1231 and may include a polymer such as polyimide, PBO, BCB, or any other suitable dielectric material. At this stage, the die connectors 124 may be buried in the protection layer 125.

The semiconductor die 120 may be or include a logic die (e.g., a central processing unit (CPU), a graphics processing unit (GPU), a system-on-a-chip (SoC), an application processor (AP), and a microcontroller); a power management die; a wireless and radio frequency (RF) die; a baseband (BB) die; a sensor die; a micro-electro-mechanical-system (MEMS) die; a signal processing die; a front-end die (e.g., an analog front-end (AFE) die); an application-specific integrated circuit (ASIC) die; a combination thereof; or the like. In alternative embodiments, the semiconductor die 120 may be or include a memory die (e.g., a dynamic random-access memory (DRAM) die, a static random-access memory (SRAM) die, a resistive random-access memory (RRAM), a magneto-resistive random-access memory (MRAM), a NAND flash memory, a hybrid memory cube (HMC) module, a high bandwidth memory (HBM) module); a combination thereof; or the like. In alternative embodiments, the semiconductor die 120 may be or include an artificial intelligence (AI) engine; a computing system (e.g., an AI server, a high-performance computing (HPC) system, a high-power computing device, a cloud computing system, a networking system, an edge computing system, a SoIC system, etc.); a combination thereof; or the like.

Figure 1D:
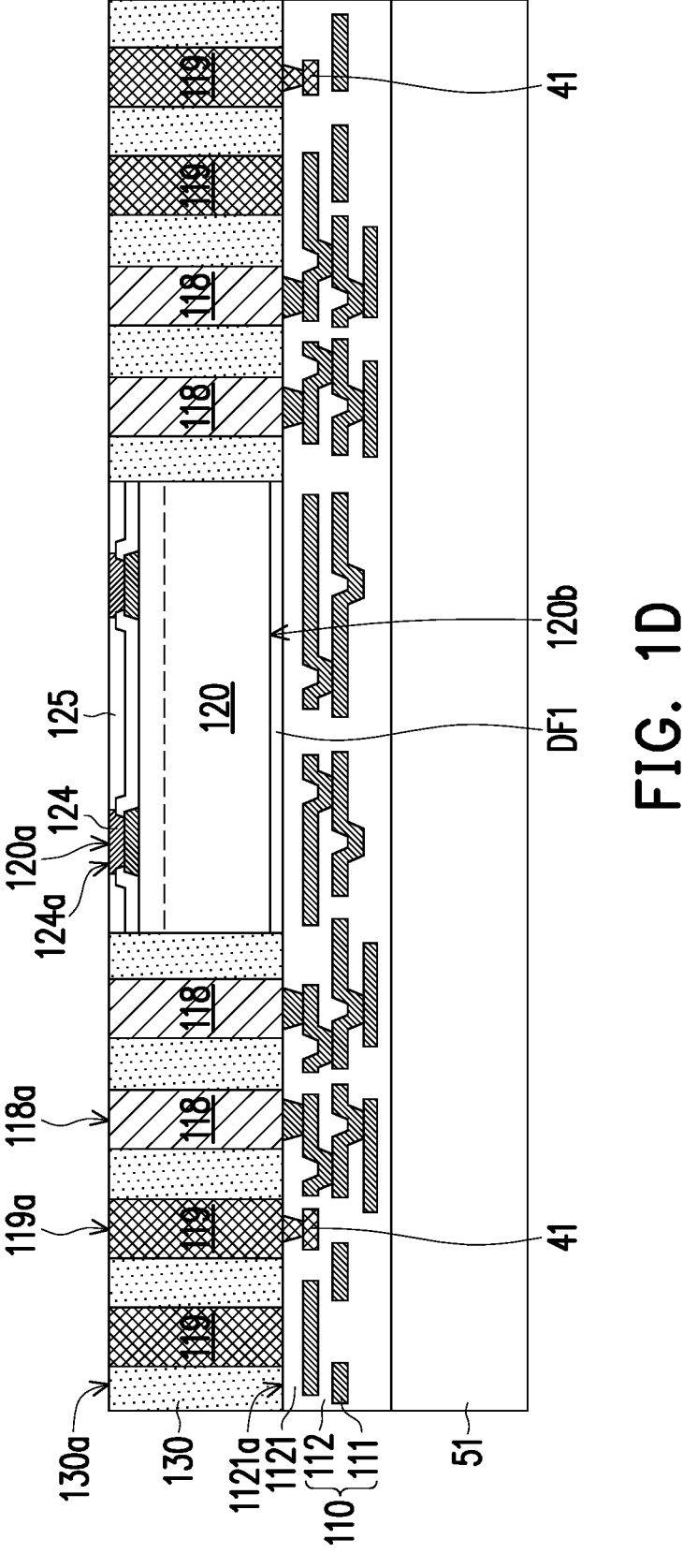

Referring to FIG. 1D and with reference to FIG. 1C, an insulating encapsulation 130 may be formed on the first redistribution structure 110 to cover the semiconductor die 120, the connecting film DF1, and the first and second conductive pillars 118 and 119. In some embodiments, the insulating encapsulation 130 is formed from an epoxy, resin, PBO, polyimide, oxide, nitride, or another electrically insulating material. In embodiments where the insulating encapsulation 130 is formed from a flowable material such as a gel or liquid, a mold, molding chase may be is used to retain the molding material during application and subsequent curing. In some embodiments, the insulating encapsulation 130 may include inorganic filler or inorganic compound (e.g., silica, clay, etc.) which can be added therein to optimize coefficient of thermal expansion (CTE) of the insulating encapsulation 130. The disclosure is not limited thereto.

In some embodiments, a layer of molding material is formed over the top surface 1121a of the topmost sublayer 1121 of the first dielectric layer 112 to encapsulate the semiconductor die 120, the connecting film DF1, and the first and second conductive pillars 118 and 119. It has been discovered that arranging the second conductive pillars 119 along the edges of the first redistribution structure 110 (or the temporary carrier 51) to form a close loop together with the first conductive pillars 118 may increase the flow uniformity of the molding material during the molding process. If only first conductive pillars 118 are disposed without the second conductive pillars 119 surrounding the first conductive pillars 118, the uneven arrangement of the first conductive pillars 118 causes the turbulence of flow at certain locations during the molding, thereby forming voids in the insulating encapsulation 130 or delamination between the first conductive pillars 118 and the insulating encapsulation 130. The increased metal density and more regular distribution around the edges in the molding material provided by the second conductive pillars 119 may provide the uniformity of flow velocity at various points within the mold cavity, and thus formation of air traps and/or delamination may be prevented. Especially, the second TIVs 119 having at least one end connected to the first dummy pattern 41 may be more reliable to withstand the stress during the molding process.

A planarization process (e.g., chemical mechanical polishing (CMP), mechanical grinding, etching, a combination thereof, etc.) may be optionally performed on the insulating encapsulation material until the first and second conductive pillars 118 and 119 and the die connectors 124 are accessibly exposed. During the planarization process, a portion of the protection layer 125 of the semiconductor die 120 may be removed to accessibly reveal the die connectors 124. For example, the first surfaces 124a of the die connectors 124 are referred to as the active surface 120a of the semiconductor die 120 opposite to the back surface 120b. In some embodiments, the first and second conductive pillars 118 and 119 that penetrate through the insulating encapsulation 130 may be referred to as through insulating vias (TIVs). In some embodiments, the first surface 130a of the insulating encapsulation 130 is substantially leveled (or coplanar) with the first surfaces 118a of the first TIVs 118, the first surfaces 119a of the second TIVs 119, and the active surface 120a of the semiconductor die 120, within process variations.

Figure 1E:
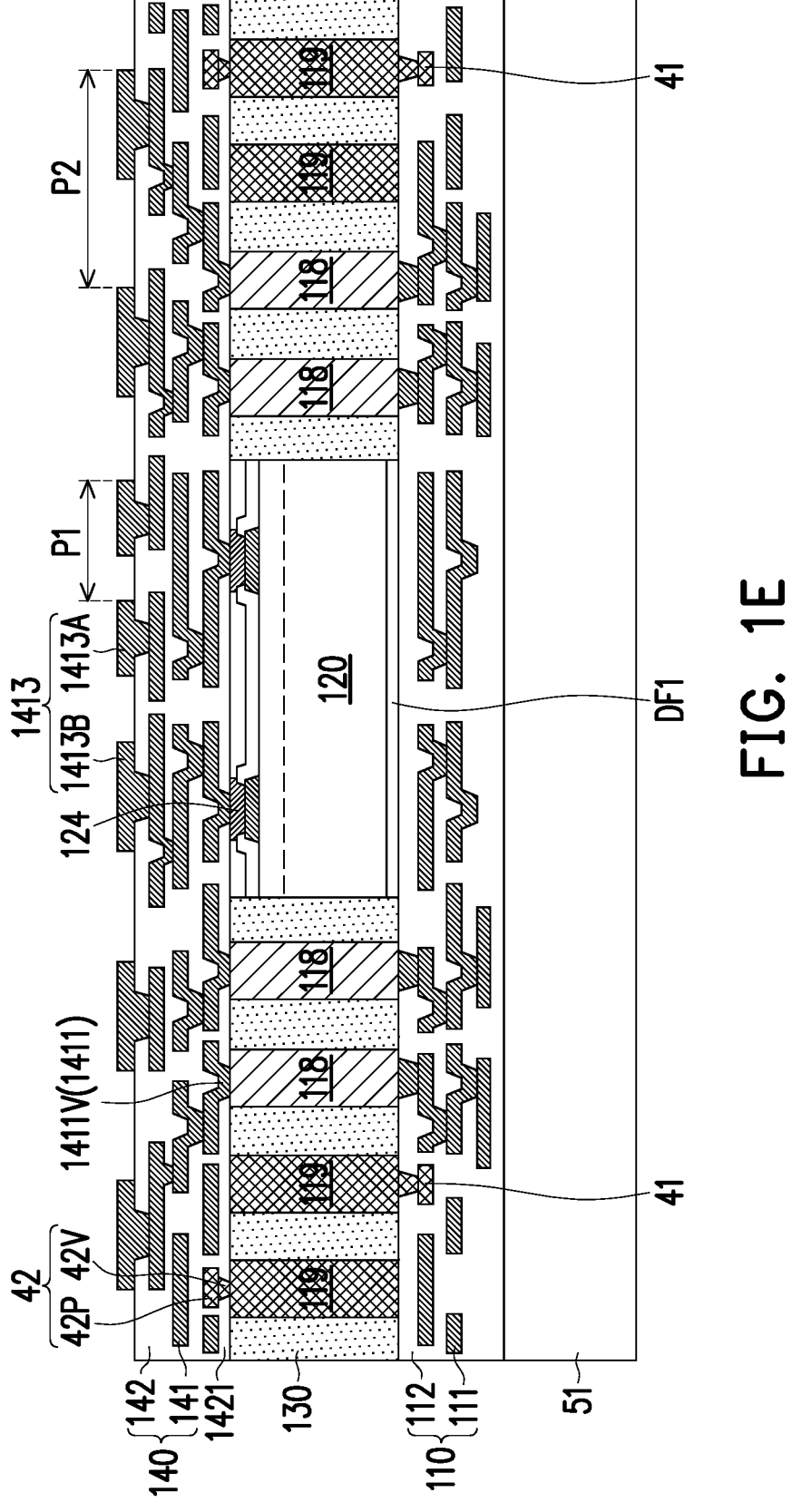

Referring to FIG. 1E and with reference to FIG. 1D, a second redistribution structure 140 may be formed on the semiconductor die 120, the first and second TIVs 118 and 119, and the insulating encapsulation 130. The second redistribution structure 140 may be referred to as a front-side redistribution structure as it is disposed on the active side of the semiconductor die 120, while the first redistribution structure 110 may be referred to as a backside redistribution structure as it is disposed below the backside of the semiconductor die 120. The second redistribution structure 140 may include one or more second patterned conductive layer(s) 141 embedded in one or more second dielectric layer(s) 142. The materials of the second patterned conductive layer 141 and the second dielectric layer 142 may be similar to those of the first patterned conductive layer 111 and the first dielectric layer 112, respectively.

In some embodiments, the bottommost sublayer 1421 of the second dielectric layer 142 is formed and patterned by using lithography and etching or other suitable processes, and then the bottommost sublayer 1411 of the second patterned conductive layer 141 is formed on the top surface of the bottommost sublayer 1421 of the second dielectric layer 142 and in openings of the bottommost sublayer 1421 of the second dielectric layer 142 to be in physical and electrical contact with the die connectors 124 of the semiconductor die 120 and the first TIVs 118. For example, the via portions 1411V of the bottommost sublayer 1411 of the second patterned conductive layer 141 directly land on the first surfaces 124a of the die connectors 124 and the first surfaces 118a of the first TIVs 118. The steps of forming sublayers of the second dielectric layer 142 and the second patterned conductive layer 141 may be repeated to form a multi-layered redistribution structure.

In some embodiments, the topmost sublayer 1413 of the second patterned conductive layer 141 includes first pads 1413A and second pads 1413B surrounding the first pads 1413A. The pitch P1 of the adjacent first pads 1413A may be less than the pitch P2 of the adjacent second pads 1413B. The density per unit area of the first pads 1413A may be denser than that of the second pads 1413B. The first and second pads 1413A and 1413B formed on the top surface of the topmost sublayer 1423 of the second dielectric layer 142 may be or include under bump metallization (UBM) pads for further electrical connection. It is noted that the number of sublayers of the second dielectric layer 142 and the second patterned conductive layer 141 in the second redistribution structure 140 construes no limitation in the disclosure. In addition, other methods of forming the second redistribution structure 140 are possible and fully intended to be included within the scope of the disclosure.

With continued reference to FIG. 1E and FIG. 1D, during the formation of the bottommost sublayer 1411 of the second patterned conductive layer 141, a second dummy pattern 42 may be formed in the second dielectric layer 142 and coupled to the second TIVs 119. The second dummy pattern 42 and the bottommost sublayer 1411 of the second patterned conductive layer 141 are formed at a same level in the second redistribution structure 140. For example, when forming the bottommost sublayer 1421 of the second dielectric layer 142, the bottommost sublayer 1421 of the second dielectric layer 142 is patterned to have openings for accommodating the second dummy pattern 42. Subsequently, when forming the bottommost sublayer 1411 of the second patterned conductive layer 141, the via portions 42V of the second dummy pattern 42 may be formed in the openings of the bottommost sublayer 1421 to land on the first surfaces 119a of the second TIVs 119, and the pad portions 42P of the second dummy pattern 42 may be formed on the corresponding via portions 42V.

In some embodiments, the critical dimension of the respective via portion 42V is less than the critical dimension the respective via portion 1411V of the bottommost sublayer 1411 of the second patterned conductive layer 141. The respective via portion 1411V of the bottommost sublayer 1411 of the second patterned conductive layer 141 may have a recessed top surface. By way of example and not limitation, the critical dimension of the respective via portion 42V may be about 45 μm. The pad portions 42P of the second dummy pattern 42 covering the top surfaces of the corresponding via portions 42V may have a critical dimension of about 59 μm, for example. In some embodiments, the via portions 42V may have a tapered profile tapering from the corresponding pad portion 42P toward the corresponding second TIVs 119, and the via portions 1411V of the bottommost sublayer 1411 may also have a tapered profile tapering toward the corresponding first TIVs 118.

In some embodiments, some of the line portions (or the pad portions) of the bottommost sublayer 1411 of the second patterned conductive layer 141 extend right above the first surface 119a of some of the second TIVs 119. In such cases, no second dummy pattern 42 will be formed on these second TIVs 119. That is, the second dummy pattern 42 is only formed at the locations which is free of routing of the bottommost sublayer 1411 of the second patterned conductive layer 141. The second dummy pattern 42 may be electrically and spatially isolated from the second patterned conductive layer 141 through the second dielectric layer 142. For example, the second dummy pattern 42 is electrically floating in the second redistribution structure 140.

All the second conductive pillars 119 are electrically floating. Various types of second conductive pillars 119 are illustrated and described in detail. As illustrated in FIG. 1E, the second conductive pillars 119 may include multiple portions (e.g., first, second, third and fourth portions). The first portion of the second conductive pillars 119 includes a top surface and a bottom surface, wherein the top surface of the first portion of the second conductive pillars 119 is in contact with the second dummy pattern 42 formed in the second redistribution structure 140, and the bottom surface of the first portion of the second conductive pillars 119 is in contact with the topmost sublayer 1121 of the first dielectric layer 112. The number of the first portion of the second conductive pillars 119 illustrated in FIG. 1E is not limited to 1, the number of the first portion of the second conductive pillars 119 may be greater than 1. The second portion of the second conductive pillars 119 includes a top surface and a bottom surface, wherein the top surface of the second portion of the second conductive pillars 119 is in contact with the bottommost sublayer 1421 of the second dielectric layer 142, and the bottom surface of the second portion of the second conductive pillars 119 is in contact with the first dummy pattern 41 formed in the first redistribution structure 110. The number of the second portion of the second conductive pillars 119 illustrated in FIG. 1E is not limited to 1, the number of the second portion of the second conductive pillars 119 may be greater than 1. The third portion of the second conductive pillars 119 includes a top surface and a bottom surface, wherein the top surface of the third portion of the second conductive pillars 119 is in contact with the bottommost sublayer 1421 of the second dielectric layer 142, and the bottom surface of the third portion of the second conductive pillars 119 is in contact with the topmost sublayer 1121 of the first dielectric layer 112. The number of the third portion of the second conductive pillars 119 illustrated in FIG. 1E is not limited to 1, the number of the third portion of the second conductive pillars 119 may be greater than 1. The fourth portion of the second conductive pillars 119 includes a top surface and a bottom surface, wherein the top surface of the fourth portion of the second conductive pillars 119 is in contact with the second dummy pattern 42 formed in the second redistribution structure 140, and the bottom surface of the fourth portion of the second conductive pillars 119 is in contact with the first dummy pattern 41 formed in the first redistribution structure 110. The number of the fourth portion of the second conductive pillars 119 illustrated in FIG. 1E is not limited to 1, the number of the fourth portion of the second conductive pillars 119 may be greater than 1. In some embodiments, the first portion, the second portion, the third portion and the fourth portion of the second conductive pillars 119 are separated from one another. In some other embodiments, at least two portions among the first portion, the second portion, the third portion and the fourth portion of the second conductive pillars 119 share a same pad portion 41P or a same pad portion 42P. In other words, the pod portion 41P or the pad portion 42P may be electrically connected to at least two portions among the first portion, the second portion, the third portion and the fourth portion of the second conductive pillars 119.

Figure 1F:
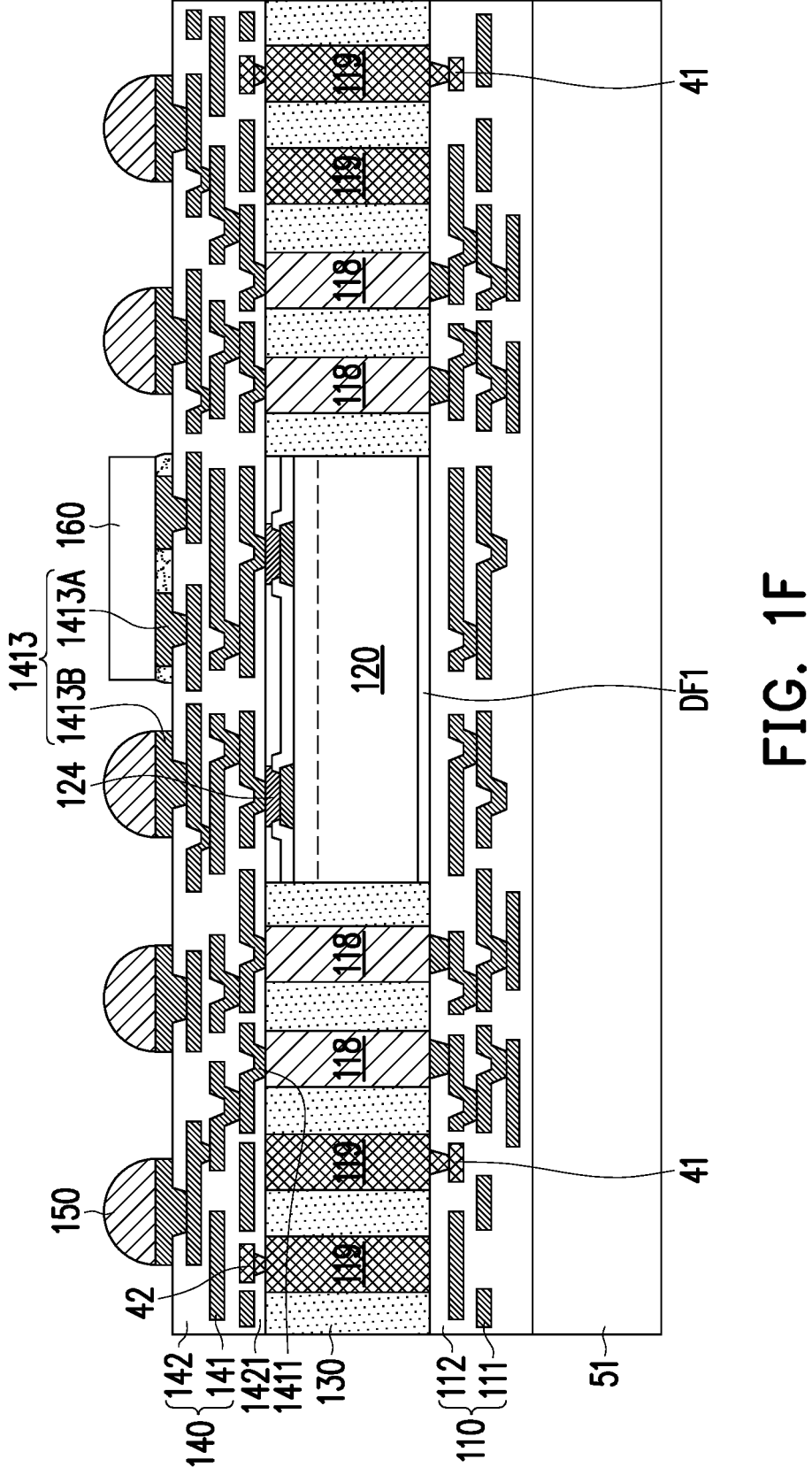

Referring to FIG. 1F and with reference to FIG. 1E, conductive terminals 150 are formed on the second pads 1413B of the second patterned conductive layer 141 of the second redistribution structure 140. The conductive terminals 150 may include a conductive material such as solder, copper, aluminum, gold, nickel, silver, palladium, tin, the like, or a combination thereof. The conductive terminals 210 may be solder balls, metal pillars, a ball grid array (BGA), controlled collapse chip connection (C4) bumps, micro bumps, electroless nickel-electroless palladium-immersion gold (ENEPIG) technique formed bumps, combination thereof (e.g., a metal pillar having a solder ball attached thereof), or the like. In some embodiments, the conductive terminals 150 include an eutectic material and may include a solder bump, a solder ball, or the like. A reflow process may be performed, giving the conductive terminals 150 a shape of a partial sphere. Alternatively, the conductive terminals 150 may include non-spherical conductive connectors or other shapes.

In some embodiments, an electrical device 160, such as an integrated passive device (IPD), is optionally disposed on and electrically coupled to the second redistribution structure 140 through the first pads 1413A of the second patterned conductive layer 141 of the second redistribution structure 140. For example, conductive joints (e.g., solder joints; not labeled) may be formed between the electrical device 160 and the underlying first pads 1413A. The conductive joints may include a same material (e.g., solder) as the conductive terminals 150. The electrical device 160 may be electrically coupled to the semiconductor die 120 through the second patterned conductive layer 141 of the second redistribution structure 140. The electrical device 160 may be disposed right above the semiconductor die 120 to reduce the electrical path therebetween. In some embodiments, an underfill layer UF1 may be formed in a gap between the electrical device 160 and the second redistribution structure 140 to surround the conductive joints and the first pads 1413A for protection.

Figure 1G:
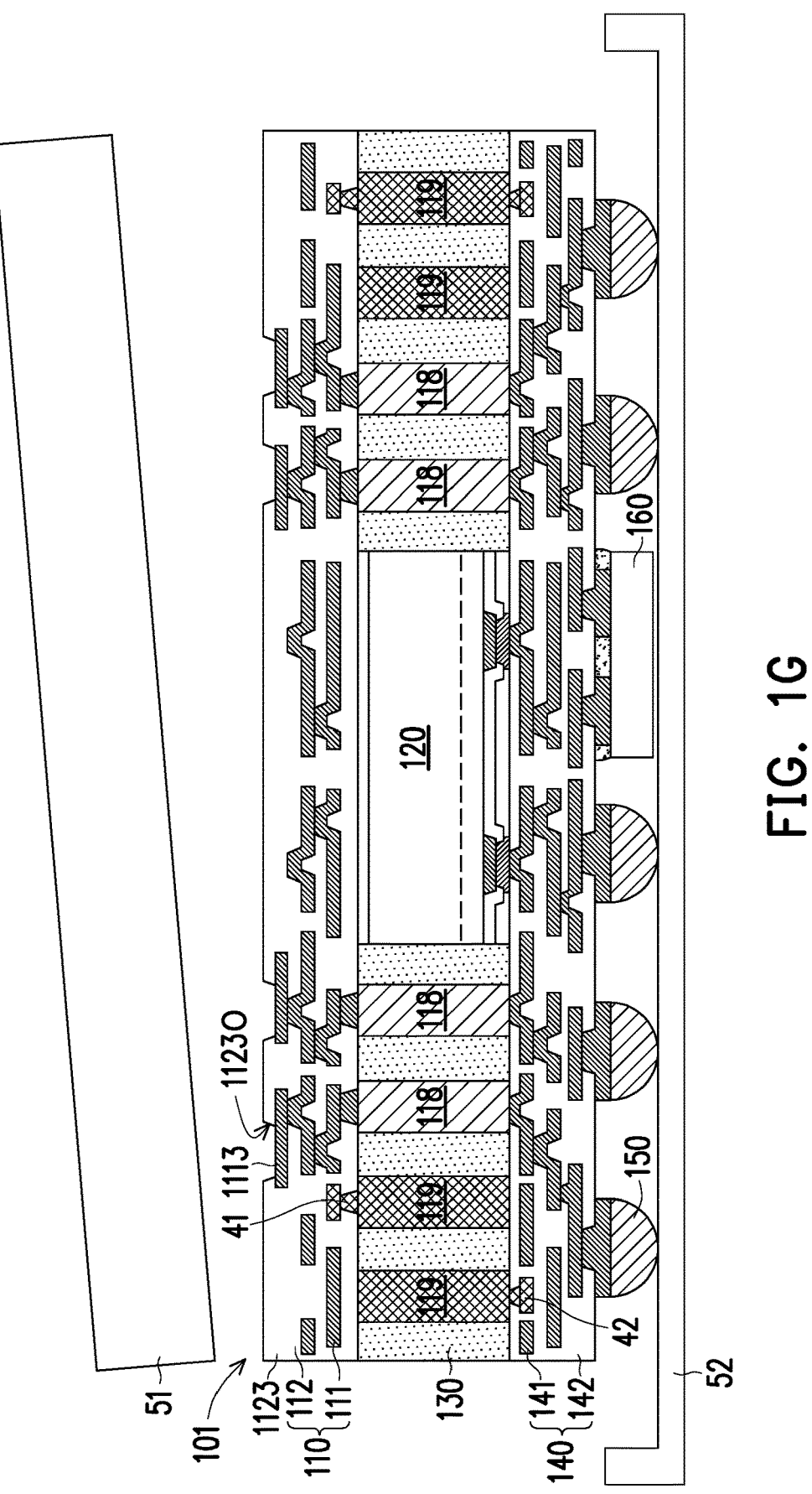

Referring to FIG. 1G and with reference to FIG. 1F, the structure of FIG. 1F may be flipped upside-down, and the conductive terminals 150 and/or the electrical device 160 may be disposed on a frame 52. The temporary carrier 51 may be removed to accessibly reveal the bottommost sublayer 1123 of the first dielectric layer 112 of the first redistribution structure 110. The temporary carrier 51 may be removed by a suitable process, such as etching, grinding, mechanical peeling-off, etc. In embodiments where an adhesive layer (e.g., a LTHC film) is formed on the temporary carrier 51, the temporary carrier 51 is de-bonded by exposing to a laser or UV light. The laser or UV light breaks the chemical bonds of the adhesive layer that binds to the temporary carrier 51, and the temporary carrier 51 may then be de-bonded. Residues of the adhesive layer (if any) may be removed by a cleaning process performed after the carrier de-bonding process.

Once the temporary carrier 51 is de-bonded, openings 1123O may be formed in the exposed sublayer 1123 of the first dielectric layer 112. The material of the sublayer 1123 of the first dielectric layer 112 may be different from the material(s) of the underlying sublayers of the first dielectric layer 112. In some embodiments where the sublayer 1123 of the first dielectric layer 112 is a solder resist layer, the openings 1123O are formed by laser drilling. Other suitable methods (e.g., lithography and etching, or the like) may be used to form the openings 1123O, depending on the material of the sublayer 1123 of the first dielectric layer 112. The openings 1123O may accessibly reveal contact pads (e.g., UBM pads) of the outermost sublayer 1113 of the first patterned conductive layer 111. In some embodiments, the structure formed on the frame 53 shown in FIG. 1G is collectively viewed as a lower package component 101. In some other embodiments, after performing the de-bonding process, a backside enhanced layer (BEL) is formed to cover the revealed surface of the outermost sublayer 1113 of the first patterned conductive layer 111. The backside enhanced layer may be a dielectric layer for marking and warpage control. The backside enhanced layer (BEL) may reduce warpage of the resulted structure illustrated in FIG. 1G and provide marking recognition. In other words, product marking may be formed on the surface of the backside enhanced layer through a laser marking process. The backside enhanced layer may be formed through lamination process followed by curing process. The backside enhanced layer and the sublayer 1123 are then patterned such that openings 1123O are formed to reveal the outermost sublayer 1113. The backside enhanced layer and the outermost sublayer 1113 may be patterned through a laser drilling process or other suitable patterning process.

Figure 1H:
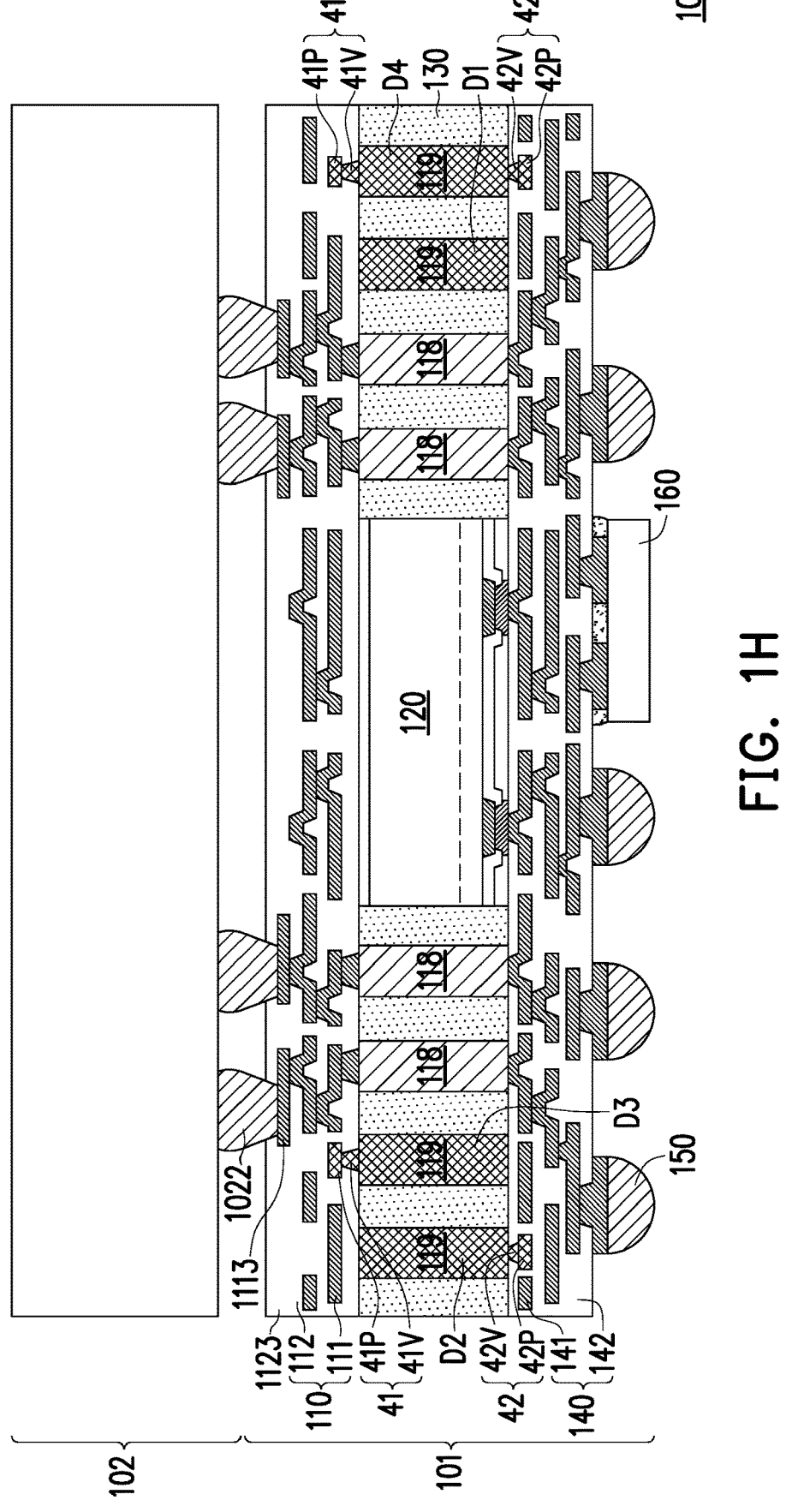

Referring to FIG. 1H and with reference to FIG. 1G, an upper package component 102 may be disposed over the first redistribution structure 110 and electrically coupled to the lower package component 101 through conductive joints 1022 formed in the openings 1123O so as to form a semiconductor package 10. The upper package component 102 may be (or include) a memory package or other types of package component(s) which is not limited thereto. For example, the upper package component 102 is electrically coupled to the semiconductor die 120 through the conductive joints 1022, the first patterned conductive layer 111 of the first redistribution structure 110, the first TIVs 118, and the second patterned conductive layer 141 of the second redistribution structure 140.

In some embodiments, coupling the upper package component 102 to the lower package component 101 includes: forming a pre-solder layer (not shown) on the contact pads of the sublayer 1113 of the first patterned conductive layer 111 within the openings 1123O; disposing external terminals of the upper package component 102 on the pre-solder layer; performing a reflow process on the external terminals and the pre-solder layer to form conductive joints 1022 connecting the upper package component 102 and the lower package component 101. In some embodiments, the external terminals of the upper package component 102 and the pre-solder layer include a solder material, and the conductive joints 1022 connecting therebetween are solder joints. In some embodiments, an underfill layer (not shown) is optionally formed between the upper package component 102 and the lower package component 101 to surround the conductive joints 1022.

In some embodiments, the lower package component 101 is formed at wafer level, and a singulation process may be performed to form individual lower package components 101, and then the frame 52 may be removed from the lower package component 101. After the singulation process, the lower package component 101 may have a coterminous sidewall (or called a package edge) including sidewalls of the first dielectric layer 112 of the first redistribution structure 110, the insulating encapsulation 130, and the second dielectric layer 142 of the second redistribution structure 140. In some embodiments, the conductive terminals 150 may be coupled to a circuit substrate (not shown) or a power supply component, and the signal of the circuit substrate or the power may be delivered/supplied through an electrical path including the conductive terminals 150, the second patterned conductive layer 141 of the second redistribution structure 140, the first TIVs 118, the first patterned conductive layer 111 of the first redistribution structure 110, and the conductive joints 1022, to the upper package component 102.

With continued reference to FIG. 1H, the first redistribution structure 110 and the second redistribution structure 140 respectively disposed on the backside and active side of the semiconductor die 120, and the first redistribution structure 110 and the second redistribution structure 140 may be referred to as a backside redistribution structure 110 and a front-side redistribution structure 140, respectively. The first TIVs 118 in the semiconductor package 10 may be referred to as active TIVs (or functional TIVs), where the active TIVs 118 in the semiconductor package 10 are electrically connected to the front-side and backside redistribution structure 140 and 110. The second TIVs 119 may be referred to as dummy TIVs (or non-functional TIVs). The dummy TIVs 119 are at a floating potential and electrically insulated from the front-side and backside redistribution structure 140 and 110. The lower package component 101 of the semiconductor package 10 may include at least one type (or any combination) of dummy features distributed around the active TIVs 118 for improving the flow uniformity of flowable material when forming the insulating encapsulation 130, as discussed below.

In some embodiments, the lower package component 101 includes at least one first dummy feature D1 disposed in proximity to the active TIVs 118, where the respective first dummy feature D1 is the second TIV 119, the entireties of top and bottom surfaces of the respective first dummy feature D1 are covered by the first dielectric layer 112 and the second dielectric layer 142, respectively, and the bottommost sublayers of the first and second patterned conductive layers 111 and 141 are extend across the locations right above/underneath the respective first dummy feature D1. In some embodiments, the lower package component 101 includes at least one second dummy feature D2 disposed in proximity to the active TIVs 118, where the respective second dummy feature D2 includes the second TIV 119 and the first dummy pattern 42 connected to the bottom surface of the second TIV 119, the entirety of the top surface of the second TIV 119 is covered by the first dielectric layer 112, and the bottommost sublayer of the first patterned conductive layer 111 may extend across right over the top surface of the second TIV 119. The second dummy pattern 42 may include the via portion tapered from the pad portion toward the bottom surface of the second TIV 119.

In some embodiments, the lower package component 101 includes at least one third dummy feature D3 disposed in proximity to the active TIVs 118, where the respective third dummy feature D3 includes the second TIV 119 and the first dummy pattern 41 connected to the top surface of the second TIV 119, the entirety of the bottom surface of the second TIV 119 is covered by the second dielectric layer 142, and the bottommost sublayer of the second patterned conductive layer 141 may extend across right underneath the bottom surface of the second TIV 119. The first dummy pattern 41 may include the via portion tapered from the top surface of the second TIV 119 toward the pad portion. In some embodiments, the lower package component 101 includes at least one fourth dummy feature D4 disposed in proximity to the active TIVs 118, where the respective fourth dummy feature D4 includes the second TIV 119 having opposing ends respectively connected to the second dummy pattern 42 and the first dummy pattern 41. The via portion of the second dummy pattern 42 and the via portion of the first dummy pattern 41 may tapered toward in a same direction. For example, the via portions 42V are tapered from the corresponding pad portions 42P toward the corresponding second TIVs 119, and the via portions 41V are tapered from the corresponding second TIVs 119 toward the corresponding pad portions 41P. The contact area of the respective via portion 41V on the corresponding second TIV 119 is greater than the contact area of the respective via portion 42V on the corresponding second TIV 119.

The dummy patterns (e.g., dummy patterns 42 and/or dummy patterns 41) serving as an anchoring structure of the dummy TIVs 119 may provide more relief of the stress that accumulates during the molding process and the subsequent thermal-cycling process. The lower package component 101 may include any combination of the first, second, third, or fourth dummy features (D1, D2, D3, or D4). By arranging the dummy features in proximity to the active TIVs 118, the issues of delamination between the active TIVs 118 and the insulating encapsulation 130 and/or the issues of voids formed in the insulating encapsulation 130 may be reduced/eliminated. The arrangement of the dummy features and the active TIVs will be discussed in accompanying with FIGS. 2A-2E.

FIGS. 2A-2E are schematic top views illustrating various configurations of the active TIVs 118 and dummy TIVs 119 of dummy features (e.g., D1, D2, D3, D4) in the aforementioned semiconductor package 10, in accordance with some embodiments. Unless specified otherwise, the materials and the formation methods of the components in these embodiments are essentially the same as the like components, which are denoted by like reference numerals in the embodiments.

Figure 2A:
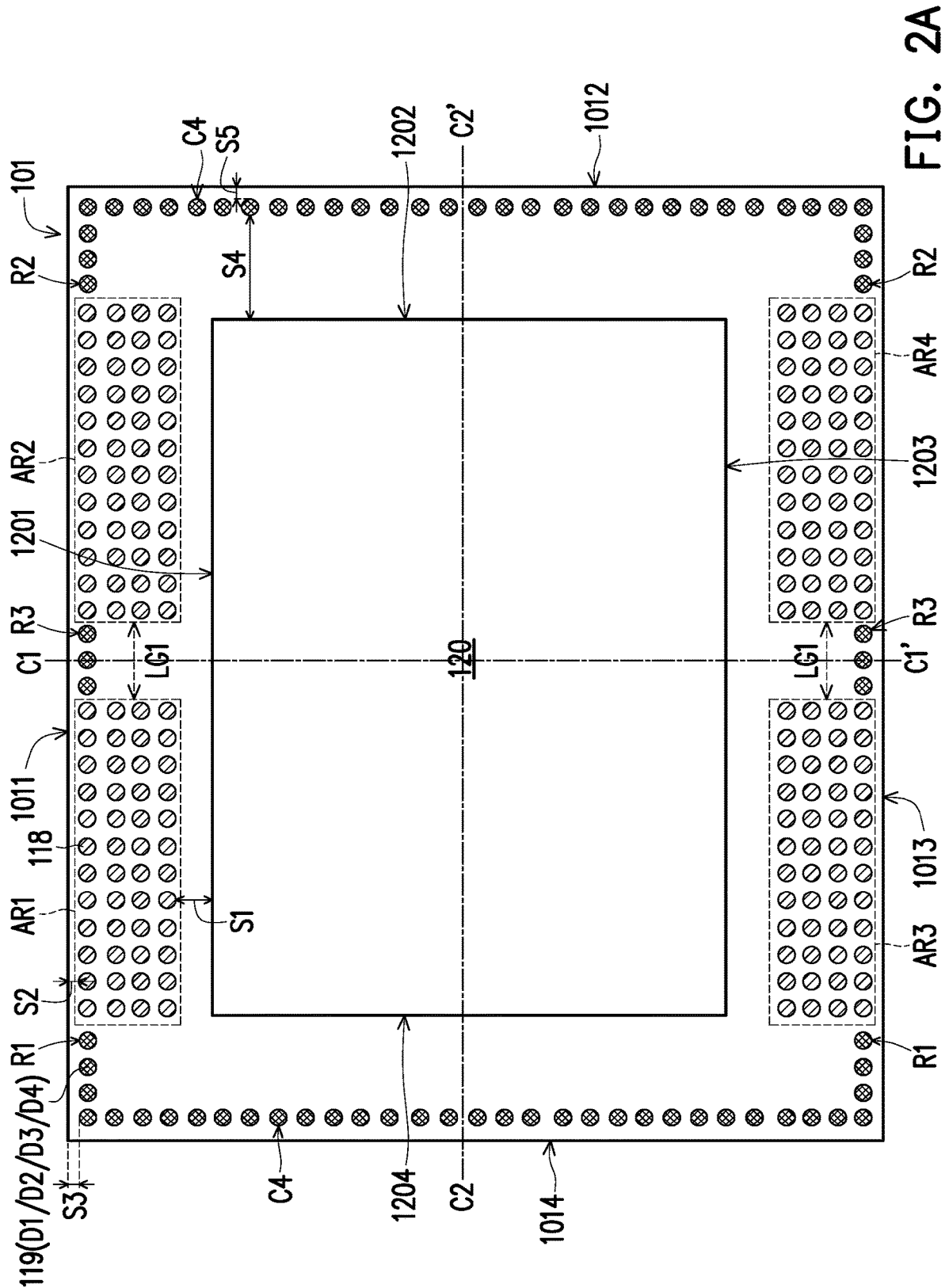
FIGS. 2A-2E are schematic top views illustrating various configurations of active through insulating vias (TIVs) and dummy TIVs of dummy features, in accordance with some embodiments.

Referring to FIG. 2A and with reference to FIG. 1H, the active TIVs 118 may be distributed in active regions (e.g., AR1, AR2, AR3, and AR4). In some embodiments, the active regions (AR1-AR4) are disposed in proximity to two opposing edges (e.g., 1201 and 1203) of the semiconductor die 120. For example, in the top view, the active regions AR1 and AR2 are disposed side by side and located between a first edge 1201 of the semiconductor die 120 and a first edge 1011 of the lower package component 101. The active regions AR3 and AR4 may be arranged side by side and located between a third edge 1203 of the semiconductor die 120 and a third edge 1013 of the lower package component 101A, where the first edge 1201 of the semiconductor die 120 corresponds to the first edge 1011 of the lower package component 101 and is opposite to the third edge 1203 of the semiconductor die 120. The edges of the lower package component 101 may also be viewed as the outer edges of the insulating encapsulation 130. Although four active regions are shown herein, the lower package component may include more (or less) active regions, depending on design requirements.

In some embodiments, the active TIVs 118 are arranged in an array in each active region (e.g., AR1, AR2, AR3, or AR4). The array in the respective active region may include m×n number of the active TIVs 118, with m number of the active TIVs 118 in each column and n number of the active TIVs 118 in each row, where n and m are integer values greater than 0, and are the same or different. In some embodiments, two adjacent active regions (e.g., AR1-AR2, or AR3-AR4) are spatially apart from each other by a lateral gap LG1, where the lateral gap LG1 is non-zero. In some embodiments, as seen from the top view, a first shortest distance S1 between an active TIV 118 in the bottommost row of the array in one of the active regions and the first edge 1201 of the semiconductor die 120 is greater than a second shortest distance S2 between an active TIV 118 in the topmost row of the array in one of the active regions and the first edge 1011 of the lower package component 101. By way of example and not limitation, the first shortest distance S1 is greater than or substantially equal to 300 μm, and the second shortest distance S2 is greater than or substantially equal to 150 μm.

With continued reference to FIG. 2A, the dummy TIVs 119 may be distributed along each edge (e.g., 1011, 1012, 1013, and 1014) of the lower package component 101 and disposed in proximity to the active TIVs 118, in the top view. For example, the dummy TIVs 119 are arranged in at least one column along each vertical edge (1012 and 1014) and arranged in at least one row along each horizontal edge (1011 and 1013). In some embodiments, a first row R1 of the dummy TIVs 119 is substantially parallel to the first edge 1011 and is located between the active region AR1 (or AR3) and the fourth edge 1014 of the lower package component 101. In some embodiments, a second row R2 of the dummy TIVs 119 is substantially parallel to the first edge 1011 and is located between the active region AR2 (or AR4) and the second edge 1012 of the lower package component 101 that is opposite to the fourth edge 1014. In some embodiments, both of the first and second rows (R1 and R2) of the dummy TIVs 119 are substantially aligned with the row of the active TIVs 118 closest to the corresponding edge of the lower package component 101 in the active regions AR1 and AR2 (or AR3 and AR4).

In some embodiments, a third row R3 of the dummy TIVs 119 is substantially parallel to the first edge 1011 (or the third edge 1013) and is located between two adjacent active regions AR1 and AR2 (or AR3 and AR4). For example, a third shortest distance S3 between an dummy TIV 119 in the first and/or second and/or third row(s) and the first edge 1011 is substantially equal to the second shortest distance S2 between an active TIV 118 in the topmost row of the array in the active region and the first edge 1011. In some embodiments, the first, second, and third rows (R1, R2, and R3) of the dummy TIVs 119 substantially aligned with the topmost (or bottommost) rows of the active TIVs 118 array in the active regions AR1 and AR2 (or AR3 and AR4) and parallel to the first edge 1011 may distributed evenly along the first edge 1011 (or the third edge 1013). For example, the pitch between two adjacent active TIVs 118 in the respective active region is substantially equal to the pitch between two adjacent dummy TIVs 119 in the respective row.

In some embodiments, a fourth column C4 of the dummy TIVs 119 is substantially parallel to the second edge 1012 (or the fourth edge 1014). For example, the fourth column C4 of the dummy TIVs 119 is distributed evenly along the second edge 1012 (or the fourth edge 1014). In some embodiments, a fourth shortest distance S4 between a dummy TIV 119 in the fourth column C4 and the second edge 1202 (or the fourth edge 1204) of the semiconductor die 120 is greater than a fifth shortest distance S5 between the dummy TIV 119 and the second edge 1012 (or the fourth edge 1014) of the lower package component 101. By way of example and not limitation, the fourth shortest distance S4 is greater than or substantially equal to 300 μm, and the fifth shortest distance S5 is greater than or substantially equal to 150 μm.

In the top view, the distribution of the active TIVs 118 and the dummy TIVs 119 on the left-handed side of the lower package component 101 and the distribution of the active TIVs 118 and the dummy TIVs 119 on the right-handed side of the lower package component 101 may be substantially symmetrical, with relative to the center line C1-C1' of the semiconductor die 120. In the top view, the distribution of the active TIVs 118 and the dummy TIVs 119 on the upper side of the lower package component 101 and the distribution of the active TIVs 118 and the dummy TIVs 119 on the lower side of the lower package component 101 may be substantially symmetrical, with relative to the center line C2-C2' of the semiconductor die 120. The symmetrical configuration of the active TIVs 118 and the dummy TIVs 119 may make flow distribution of the molding material more even during the molding process, which may reduce the chance of interface delamination and formation of voids. In addition, by arranging the dummy TIVs 119 along each edge of the lower package component 101 at the locations where the active TIVs 118 are not disposed on so as to form a close loop around all edges of the lower package component 101, the flow uniformity of the molding material may increase during the molding process; therefore, formation of air traps and/or delamination in the insulating encapsulation may be prevented.

Figure 2B:
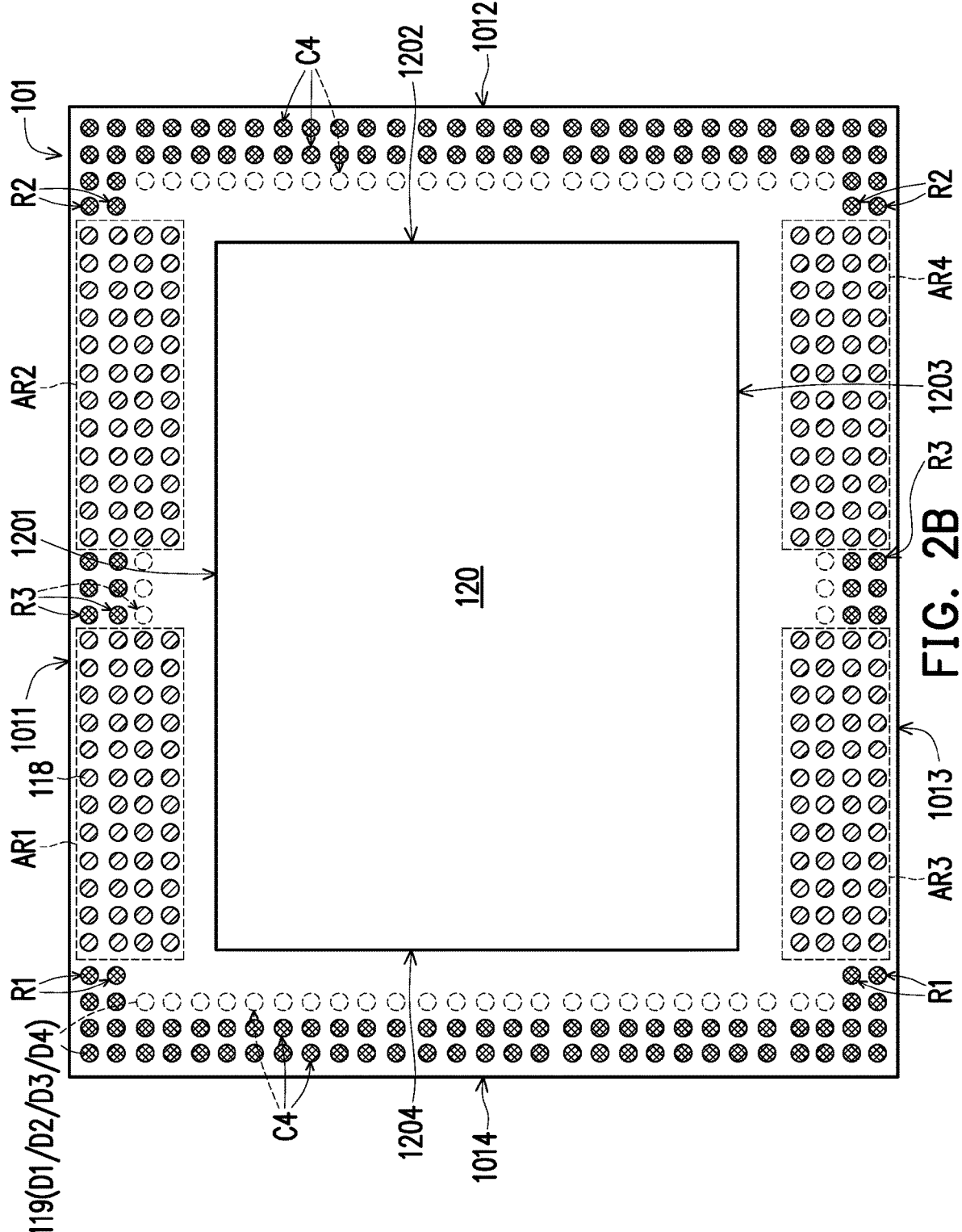

Referring to FIG. 2B and with reference to FIG. 2A, the arrangements of the active TIVs 118 and the dummy TIVs 119 of the lower package component 101 may be similar to those of the active TIVs 118 and the dummy TIVs 119 described in FIG. 2A, and thus the detailed descriptions are not repeated for the sake of brevity. The difference between FIG. 2B and FIG. 2A lies in that the dummy TIVs 119 are arranged in multiple columns and rows at the locations where the active TIVs 118 are not disposed on. For example, more than one (e.g., 2 rows, 3 rows, or more) first rows R1 of the dummy TIVs 119 are substantially parallel to the first edge 1011 and are located between the active region AR1 (or AR3) and the fourth edge 1014. In some embodiments, more than one (e.g., 2 rows, 3 rows, or more) second rows R2 of the dummy TIVs 119 are substantially parallel to the first edge 1011 and are located between the active region AR2 (or AR4) and the second edge 1012. The pitch between these first/second rows R1/R2 of the dummy TIVs 119 may be substantially equal to that of the adjacent two rows of the active TIVs 118 in the adjacent active region.

In some embodiments, more than one (e.g., 2 rows, 3 rows, or more) third rows R3 of the dummy TIVs 119 are substantially parallel to the first edge 1011 (or the third edge 1013) and are located between two adjacent active regions AR1 and AR2 (or AR3 and AR4). In some embodiments, the number of the first/second rows R1/R2 is different from (e.g., less than) the number of the third rows R3. Alternatively, the number of the first, second, and third rows (R1, R2, and R3) may be the same. In some embodiments, the number of the rows of the dummy TIVs 119 is less than (or equal to) the number of the rows of the active TIVs 118 in the respective active region. In some embodiments, more than one (e.g., 2 columns, 3 columns, or more) fourth columns C4 of the dummy TIVs 119 are substantially parallel to the second edge 1012 (or the fourth edge 1014). The number of the fourth columns C4 in proximity to the second side 1012 may be the same as that of the fourth columns C4 in proximity to the fourth side 1014. Alternatively, the number of the fourth columns C4 along the second side 1012 and along the fourth side 1014 may be different. It is noted that some of the dummy TIVs 144 illustrated in dashed lines indicate they may (or may not) exist.

Figure 2C:
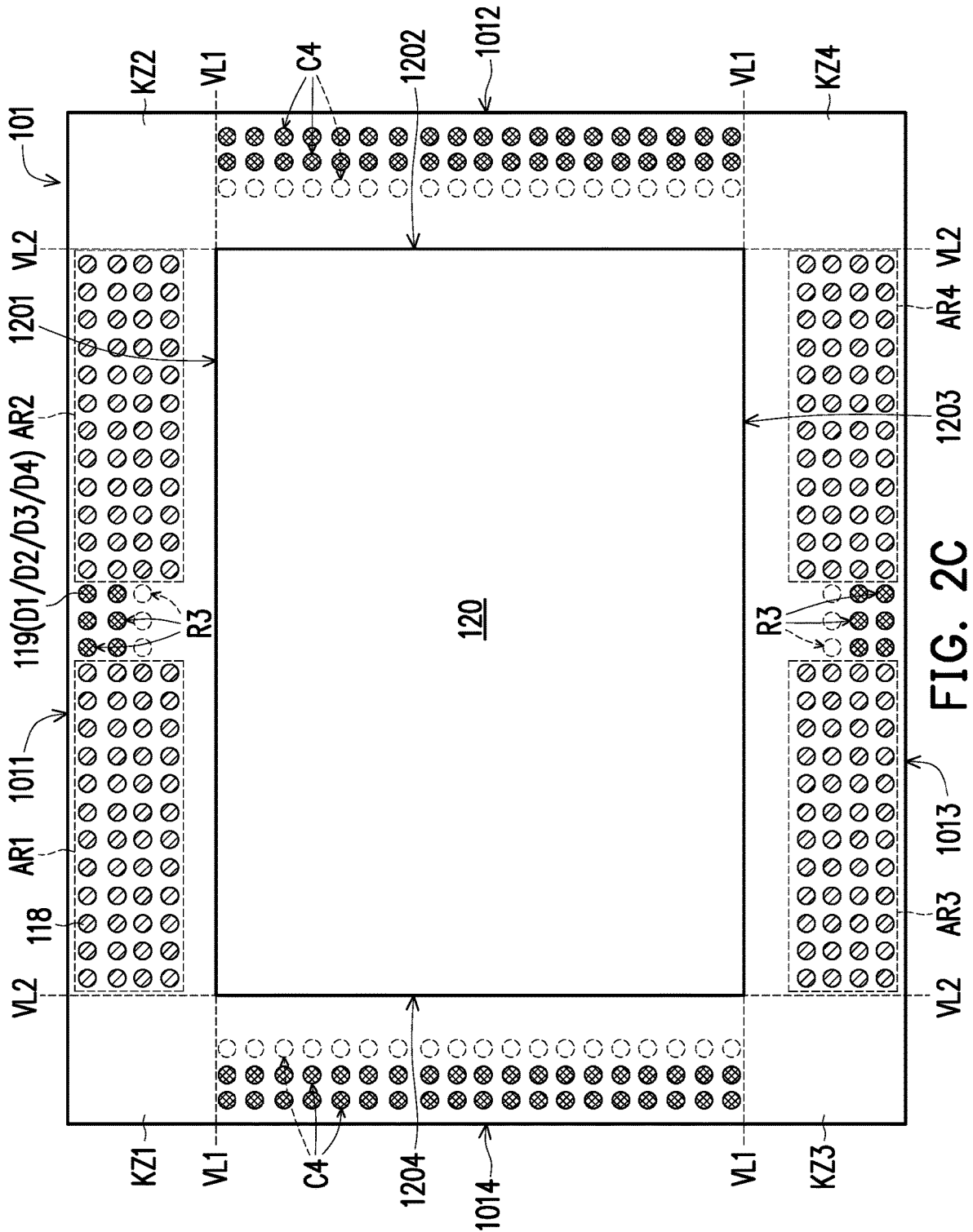

Referring to FIG. 2C and with reference to FIGS. 2A-2B, the arrangement of the active TIVs 118 of the lower package component 101 may be similar to that of the active TIVs 118 described in FIG. 2A, and thus the detailed descriptions are not repeated for the sake of brevity. In some embodiments, more than one third rows R3 of the dummy TIVs 119, as described in FIG. 2B, are arranged along the first edge 1011 (or the third edge 1013) and between two adjacent active regions AR1 and AR2 (or AR3 and AR4). In some embodiments, the first and second rows R1 and R2 of the dummy TIVs 119 shown in FIG. 2B are omitted. In some embodiments, more than one fourth columns C4 are only arranged in a region between the second edges 1202 and 1012 (or the fourth edges 1204 and 1014) from the top view. The outermost ones of the array of the dummy TIVs 119 in the fourth columns C4 may not be arranged beyond the first virtual line VL1 that horizontally coincides with the first edge 1201 (or the third edge 1203) of the semiconductor die 120. The outermost ones of the array of the active TIVs 118 in the respective active region may not be arranged beyond the second virtual line VL2 that vertically coincides with the second edge 1202 (or the fourth edge 1204) of the semiconductor die 120.

In some embodiments, a first keep-out zone KZ1, a second keep-out zone KZ2, a third keep-out zone KZ3, and a fourth keep-out zone KZ4 are respectively located at the upper left corner, the upper right corner, the lower left corner, and the lower right corner of the lower package component 101, as seen from the top view. For example, the first keep-out zone KZ1 (or the third keep-out zone KZ3) is the region defined by the first and fourth edges (1011 and 1014) of the lower package component and the virtual lines (VL1 and VL2) extending from the first and fourth edges (1201 and 1204) of the semiconductor die 120. Similarly, the second keep-out zone KZ2 (or the fourth keep-out zone KZ4) is the region defined by the first and second edges (1011 and 1012) and the virtual lines (VL1 and VL2) extending from the first and second edges (1201 and 1202) of the semiconductor die 120. The keep-out zones (KZ1-KZ4) may be free of the active TIVs 118 and the dummy TIVs 119.

Figure 2D:
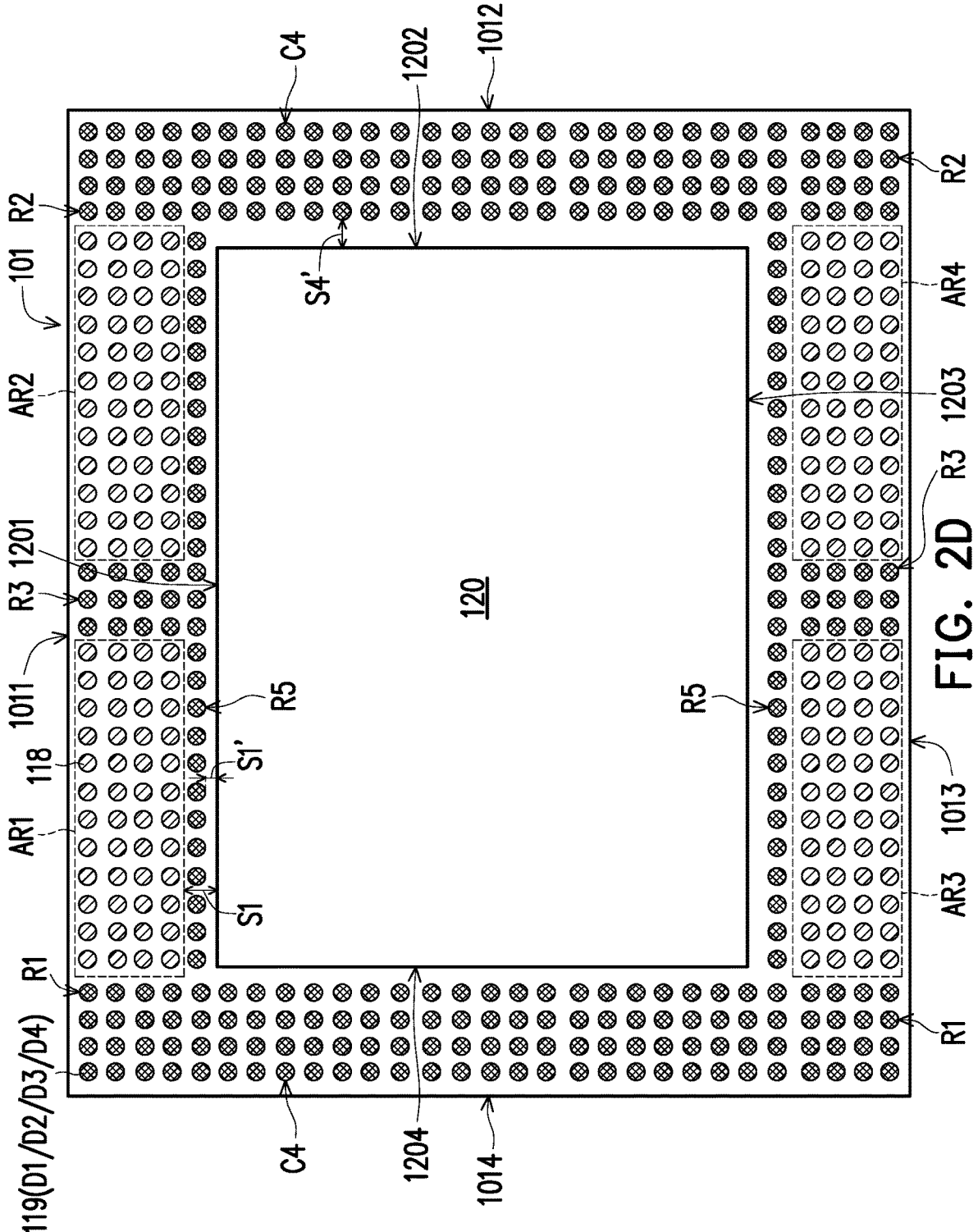

Referring to FIG. 2D and with reference to FIG. 2A, the arrangements of the active TIVs 118 and the dummy TIVs 119 of the lower package component 101 may be similar to those of the active TIVs 118 and the dummy TIVs 119 described in FIG. 2A, and thus the detailed descriptions are not repeated for the sake of brevity. The difference between FIG. 2D and FIG. 2A lies in that the dummy TIVs 119 are distributed all over the blank areas where the active TIVs 118 are not disposed on. For example, multiple first rows R1 are arranged in parallel manner between the active region AR1/AR3 and the fourth edge 1014, multiple second rows R2 are arranged in parallel manner between the active region AR2/AR4 and the second edge 1012, and multiple third rows R3 are arranged in parallel manner between adjacent active regions AR1 and AR2 (or AR3 and AR4) and between the first edges 1011 and 1201. Multiple fourth rows C4 may be arranged in parallel manner between the fourth edges 1014 and 1204 (or the second edges 1012 and 1202).

In some embodiments, a fifth row R5 of the dummy TIVs 119 is arranged between the first edge 1201 (or the third edge 1203) of the semiconductor die 120 and the active regions AR1 and AR2 (or AR3-AR4). In some embodiments, as seen from the top view, a shortest distance S1' between a dummy TIV 118 in the fifth row R5 closest to the edge (1201/1202/1203/1204) of the semiconductor die 120 is greater than the first shortest distance S1 between an active TIV 118 in the bottommost row of any active region and the edge of the semiconductor die 120. By way of example and not limitation, the shortest distance S1' is greater than or substantially equal to 150 μm. In some embodiments, a shortest distance S4' between the second edge 1202 and a dummy TIV 119 in the fourth column C4 closest to the second edge 1202 is substantially equal to the shortest distance S1', such as greater than or substantially equal to 150 μm.

Figure 2E:
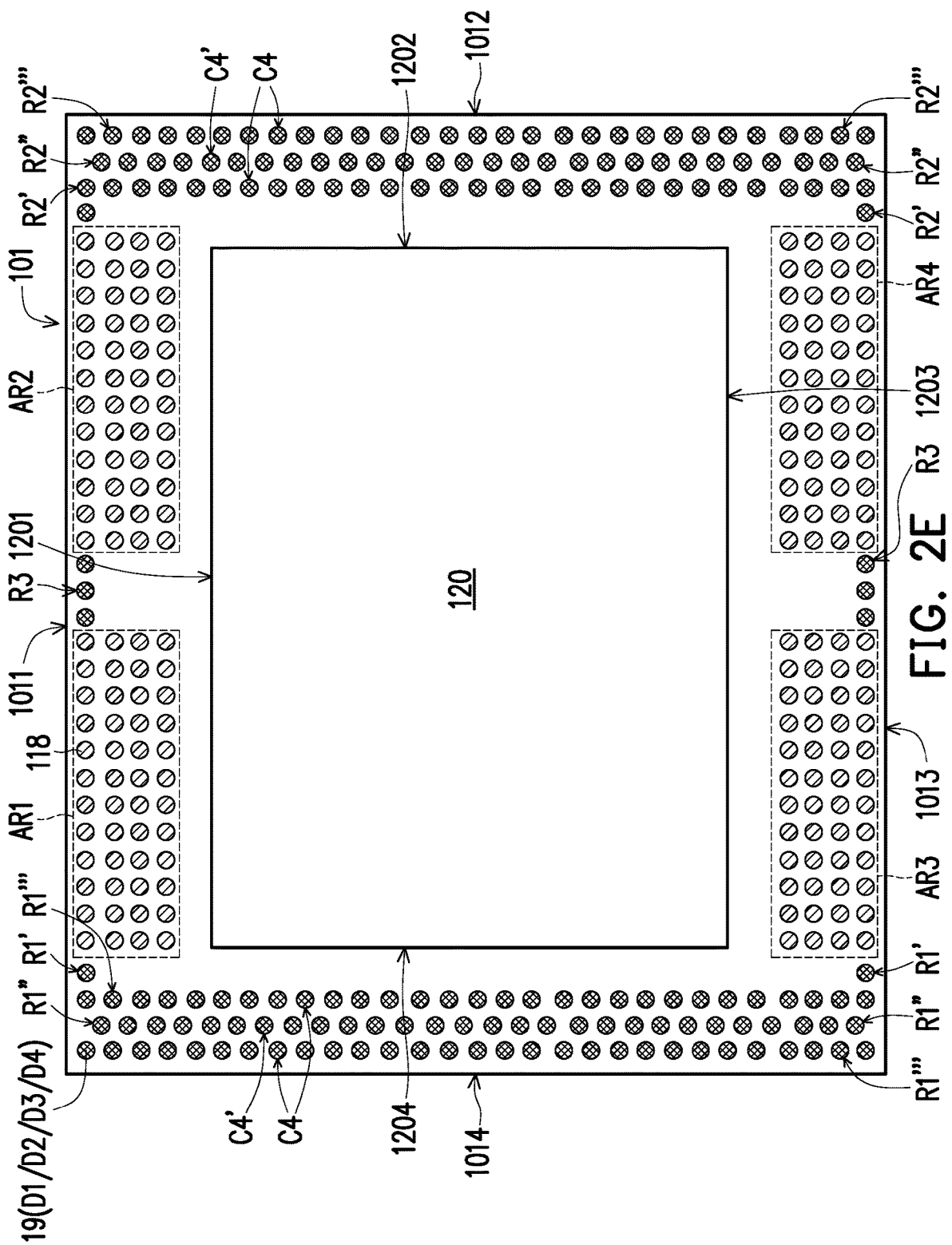

Referring to FIG. 2E and with reference to FIGS. 2A-2B, the arrangement of the active TIVs 118 of the lower package component 101 may be similar to that of the active TIVs 118 described in FIGS. 2A-2B, and thus the detailed descriptions are not repeated for the sake of brevity. The difference between FIG. 2E and FIGS. 2A-2B includes in that multiple first rows (R1', R1", and R1'") disposed between the active region AR1/AR3 and the fourth edge 1014 may be arranged in a staggered manner. multiple second rows (R2', R2", and R2'") disposed between the active region AR2/AR4 and the second edge 1012 may be arranged in a staggered manner. In some embodiments, multiple fourth columns C4 and C4' of the dummy TIVs 119 are arranged between the second edges 1202 and 1012 (or the fourth edges 1204 and 1014) in a staggered manner.

In some embodiments, the dummy TIVs 119 in the first column R1' disposed between the other first columns R1' and R1'" are horizontally offset from the other dummy TIVs 119 in the first columns R1' and R1'". In some embodiments, the number of the dummy TIVs 119 in the first column R1' is less than the number of the dummy TIVs 119 in the other first columns R1' and R1'". In some embodiments, the dummy TIVs 119 in the fourth column C4' disposed between two of the fourth columns C4 are vertically offset from these two of the fourth columns C4. In some embodiments, the number of the dummy TIVs 119 in the fourth column C4' is less than the number of the dummy TIVs 119 in the respective fourth column C4.

According to some embodiments, a semiconductor package includes a semiconductor die laterally covered by an insulating encapsulation, a first redistribution structure overlying the insulating encapsulation and a back surface of the semiconductor die, a second redistribution structure underlying the insulating encapsulation and an active surface of the semiconductor die opposite to the back surface, active TIVs penetrating through the insulating encapsulation, and dummy features. The semiconductor die is electrically coupled to the first redistribution structure through the second redistribution structure and the active TIVs. Each of the dummy features includes a dummy TIV laterally covered by the insulating encapsulation, the dummy TIVs are disposed along package edges in a top view, and the dummy features are electrically floating.

According to some alternative embodiments, a semiconductor package includes a semiconductor die laterally covered by an insulating encapsulation, active TIVs penetrating through the insulating encapsulation and electrically coupled to the semiconductor die, and dummy TIVs penetrating through the insulating encapsulation and being electrically floating. The active TIVs are arranged in active regions of the insulating encapsulation, where the active regions are disposed at two opposing edges of the semiconductor die. The dummy TIVs are distributed in a region other than the active regions and arranged along package edges in a top view.

According to some alternative embodiments, a manufacturing method of a semiconductor package includes: forming an insulating encapsulation on a backside redistribution structure to laterally cover a semiconductor die, active TIVs, and dummy TIVs on the backside redistribution structure, wherein the dummy TIVs are disposed in proximity to one of the active TIVs, and the dummy TIVs are disposed along outer edges of the insulating encapsulation in a top view; and forming a front-side redistribution structure on an active surface of the semiconductor die, the insulating encapsulation, the active TIVs, and the dummy TIVs, wherein the semiconductor die is electrically coupled to the backside redistribution structure through the front-side redistribution structure and the active TIVs, and the dummy TIVs are electrically floating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor die laterally covered by an insulating encapsulation;
a first redistribution structure overlying the insulating encapsulation and a back surface of the semiconductor die;
a second redistribution structure underlying the insulating encapsulation and an active surface of the semiconductor die opposite to the back surface;
active through insulating vias (TIVs) penetrating through the insulating encapsulation, and the semiconductor die being electrically coupled to the first redistribution structure through the second redistribution structure and the active TIVs; and
dummy features, each of the dummy features comprising a dummy TIV laterally covered by the insulating encapsulation, the dummy TIVs being disposed along package edges in a top view, and the dummy features being electrically floating, wherein the active TIVs are arranged in active regions of the semiconductor package disposed at two opposing edges of the semiconductor die in the top view, and the dummy TIVs of the dummy features are distributed along the package edges and beside the active regions.

2. The semiconductor package of claim 1, wherein the dummy features comprise:
a first dummy feature comprising the dummy TIV, a via portion connected to the dummy TIV, and a pad portion connected to the via portion.

3. The semiconductor package of claim 2, wherein a critical dimension of the via portion of the first dummy feature is less than that of a via portion of a patterned conductive layer of the second redistribution structure or the first redistribution structure, and the via portion of the patterned conductive layer is disposed at a same level as the via portion of the first dummy feature.

4. The semiconductor package of claim 2, wherein the via portion of the first dummy feature is embedded in the second redistribution structure and is tapered from the pad portion toward the dummy TIV.

5. The semiconductor package of claim 2, wherein the via portion of the first dummy feature is embedded in the first redistribution structure and is tapered from the dummy TIV toward the pad portion.

6. The semiconductor package of claim 1, wherein the dummy features comprise:
a second dummy feature comprising the dummy TIV, a front-side via portion connected to a front surface of the dummy TIV, a front-side pad portion connected to the front-side via portion, a backside via portion connected to a back surface of the dummy TIV, and a backside pad portion connected to the backside via portion, wherein the front-side via portion and the front-side pad portion are embedded in the second redistribution structure, and the backside via portion and the backside pad portion are embedded in the first redistribution structure.

7. The semiconductor package of claim 6, wherein the front-side via portion and the backside via portion of the second dummy feature are tapered in a same direction.

8. The semiconductor package of claim 1, wherein a first dielectric layer of the first redistribution structure covers an entirety of a first surface of the dummy TIV, and a second dielectric layer of the second redistribution structure covers an entirety of a second surface of the dummy TIV opposite to the first surface.

9. The semiconductor package of claim 1, wherein in the top view, the dummy TIVs are arranged in a column and the column is free of the active TIVs.

10. The semiconductor package of claim 1, wherein in the top view:
a lateral gap is between two of the active regions and a portion of the dummy TIV is disposed within the lateral gap.

11. The semiconductor package of claim 1, wherein the dummy TIVs are distributed between adjacent two of the active regions and between the two opposing edges of the semiconductor die and each of the active regions.

12. The semiconductor package of claim 1, wherein in the top view, the dummy TIVs are arranged in columns along the package edges, and the columns are in a staggered manner.

13. A semiconductor package, comprising:
a semiconductor die laterally covered by an insulating encapsulation;
active through insulating vias (TIVs) penetrating through the insulating encapsulation and electrically coupled to the semiconductor die, and the active TIVs being arranged in active regions of the insulating encapsulation, wherein the active regions are disposed at two opposing edges of the semiconductor die; and
dummy TIVs penetrating through the insulating encapsulation and being electrically floating, and the dummy TIVs being distributed in a region other than the active regions and arranged along package edges in a top view;
a front-side redistribution structure disposed on an active surface of the semiconductor die, the insulating encapsulation, the active TIVs, and the dummy TIVs; and
a front-side dummy feature comprising a front-side conductive via physically connected to at least one of the dummy TIVs, and a front-side conductive pad physically connected to the front-side conductive via, and the front-side conductive via and the front-side conductive pad being embedded in a front-side dielectric layer of the front-side redistribution structure.

14. The semiconductor package of claim 13, further comprising:
a backside redistribution structure disposed on a back surface of the semiconductor die, the insulating encapsulation, the active TIVs, and the dummy TIVs, wherein a backside dielectric layer of the backside redistribution structure covers an entirety of a surface of the at least one of the dummy TIVs.

15. The semiconductor package of claim 13, further comprising:

a backside redistribution structure disposed on a back surface of the semiconductor die, the insulating encapsulation, the active TIVs, and the dummy TIVs; and a backside dummy feature comprising a backside conductive via physically connected to at least one of the dummy TIVs, and a backside conductive pad physically connected to the backside conductive via, and the backside conductive via and the backside conductive pad being embedded in a backside dielectric layer of the backside redistribution structure.

16. The semiconductor package of claim 13, wherein the front-side dielectric layer of the front-side redistribution structure covers an entirety of a front surface of at least one of the dummy TIVs, and the semiconductor package further comprises a backside redistribution structure disposed on a back surface of the semiconductor die, and a backside dielectric layer of the backside redistribution structure covering an entirety of a back surface of the at least one of the dummy TIVs.

17. A semiconductor package, comprising:

an encapsulated die comprising a semiconductor die and an insulating encapsulation laterally covering the semiconductor die;

a first redistribution structure and a second redistribution structure disposed at two opposing sides of the encapsulated die;

active through insulating vias (TIVs) penetrating through the insulating encapsulation, and the semiconductor die being electrically coupled to the first redistribution structure through the second redistribution structure and the active TIVs; and a first dummy feature comprising a first dummy TIV, a via portion connected to the first dummy TIV, and a pad portion connected to the via portion, wherein:

in a top view, at least one of the keep-out zones of the semiconductor package is disposed on a corner of the semiconductor package and free of the active TIVs and the first dummy TIV.

18. The semiconductor package of claim 17, wherein in the top view, the active TIVs are distribution within two active regions spaced apart from each other by a lateral gap, and the first dummy TIV is disposed within the lateral gap.

19. The semiconductor package of claim 17, wherein the via portion of the first dummy feature is embedded in the second redistribution structure and is tapered from the pad portion toward the dummy first TIV.

20. The semiconductor package of claim 17, further comprising:

a second dummy feature comprising a second dummy TIV, a front-side via portion connected to a front surface of the second dummy TIV, a front-side pad portion connected to the front-side via portion, a backside via portion connected to a back surface of the second dummy TIV, and a backside pad portion connected to the backside via portion, wherein the front-side via portion and the front-side pad portion are embedded in the second redistribution structure, and the backside via portion and the backside pad portion are embedded in the first redistribution structure.

* * * * *